United States Patent
Hagen et al.

(10) Patent No.: US 8,925,286 B2
(45) Date of Patent: Jan. 6, 2015

(54) WINDOW MODULE WITH INTEGRATED ELECTROPOLYMERIC SUNSHADE

(75) Inventors: Thomas D. Hagen, Grand Blanc, MI (US); Paul R. Dynes, Bloomfield, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 643 days.

(21) Appl. No.: 13/242,262

(22) Filed: Sep. 23, 2011

(65) Prior Publication Data

US 2013/0076057 A1    Mar. 28, 2013

(51) Int. Cl.
*B60J 3/04*      (2006.01)
*H01L 31/042*    (2014.01)
*B60J 3/02*      (2006.01)

(52) U.S. Cl.
CPC ........... *H01L 31/0422* (2013.01); *B60J 3/0286* (2013.01); *B60J 3/04* (2013.01); *Y02T 10/88* (2013.01); *Y02E 10/50* (2013.01)
USPC ................. 52/786.1; 296/211; 296/96.19

(58) Field of Classification Search
CPC ....................................................... B60J 3/04
USPC ............. 296/96.19, 211, 97.5, 97.7; 52/786.1
See application file for complete search history.

(56) References Cited

U.S. PATENT DOCUMENTS

| | | | |
|---|---|---|---|
| 3,989,357 A | 11/1976 | Kalt | |
| 4,266,339 A | 5/1981 | Kalt | |
| 6,897,786 B1 * | 5/2005 | Kalt et al. | ................. 340/815.4 |
| 7,645,977 B2 | 1/2010 | Schlam et al. | |
| 8,035,075 B2 * | 10/2011 | Schlam et al. | ............ 250/214 B |
| 2002/0113168 A1 | 8/2002 | Rukavina et al. | |
| 2003/0116990 A1 * | 6/2003 | Paiva et al. | ....................... 296/56 |
| 2005/0200934 A1 | 9/2005 | Callahan et al. | |
| 2006/0284482 A1 * | 12/2006 | Yang | ............................. 303/191 |
| 2011/0174375 A1 | 7/2011 | Nattermann et al. | |
| 2012/0175908 A1 * | 7/2012 | McCarthy et al. | .......... 296/84.1 |

FOREIGN PATENT DOCUMENTS

| | | |
|---|---|---|
| CN | 201559511 U | 8/2010 |
| DE | 3545014 A1 | 6/1987 |
| DE | 19610268 C2 | 5/2001 |
| DE | 202010017493 U1 | 1/2012 |
| EP | 0393437 A1 | 10/1990 |

* cited by examiner

*Primary Examiner* — Dennis H Pedder
(74) *Attorney, Agent, or Firm* — Quinn Law Group, PLLC

(57) ABSTRACT

A window module for a vehicle includes a first glass pane and a second glass pane in a substantially parallel arrangement and separated by a spacer. The first glass pane, second glass pane, and spacer define a closed interior volume. An electropolymeric shutter is disposed within the interior volume and configured to selectively obscure the passage of light through the first and second glass pane. The electropolymeric shutter includes a deployable tinting material configured to selectively extend across the first glass pane in response to a voltage difference applied between the deployable tinting material and the first glass pane, a photovoltaic cell coupled with the second glass pane and configured to generate electrical energy when exposed to light, and a controller configured to receive the generated electrical energy from the photovoltaic cell and to selectively apply the voltage difference between the deployable tinting material and the first glass pane.

17 Claims, 2 Drawing Sheets

WINDOW MODULE WITH INTEGRATED ELECTROPOLYMERIC SUNSHADE

TECHNICAL FIELD

The present invention relates generally to a window module with an integrated electropolymeric sunshade.

BACKGROUND

Vehicles, such as automobiles include windows that allow occupants to view their environmental surroundings, without allowing environmental conditions, such as heat, cold, rain, snow, sleet, etc, to enter the passenger compartment/vehicle interior. On sunny days, infrared radiation may pass through the windows and may heat an otherwise climate-controlled vehicle interior. Under certain circumstances, occupants of the vehicle may desire to block such radiation. One such manner of blocking the infrared radiation has been to permanently adhere a tinting film to the window. While this strategy may effectively block intense infrared radiation on sunny days, it may obscure vision during night-time or dimly lit operating conditions. Therefore, it may be desirable to have a tinting mechanism that can be selectively actuated to block intense radiation during sunny conditions, while allowing full transparency during dimly lit conditions.

SUMMARY

A window module for a vehicle includes a first glass pane and a second glass pane disposed in a substantially parallel arrangement and separated by a spacer. The first glass pane, second glass pane, and spacer define a closed interior volume, where an electropolymeric shutter may be disposed to selectively obscure the passage of light through the first and second glass pane.

The electropolymeric shutter may include a deployable tinting material, a photovoltaic cell and a controller. The deployable tinting material may be configured to selectively extend across the first glass pane in response to a voltage difference applied between the tinting material and the first glass pane. The photovoltaic cell may be coupled with the second glass pane and configured to generate electrical energy when exposed to light; and the controller may configured to receive the generated electrical energy from the photovoltaic cell and to selectively apply the voltage difference between the deployable tinting material and the first glass pane.

The controller may further include an energy storage device configured to store the electrical energy generated by the photovoltaic cell. In one configuration, the electropolymeric shutter may be self-powered such that it does not require an external power supply. For example, the photovoltaic cell may be configured to generate a sufficient amount of electrical energy to maintain the deployable tinting material in an extended state.

The deployable tinting material may include a conductive layer, and the first glass pane may include a conductive glaze arranged in such a manner that a voltage difference between the conductive layer and the conductive glaze may cause the deployable tinting material to extend across the first glass pane. In one configuration, the controller may be configured to extend the deployable tinting material after it receives an amount of electrical energy from the photovoltaic cell above a threshold and further when it senses that the vehicle is stationary.

The spacer may be disposed about the perimeter of the first glass pane, with the photovoltaic cell and the controller disposed adjacent the spacer. Furthermore, the second glass pane may include an overhanging portion that extends beyond the spacer. The overhanging portion of the second glass pane may be configured to secure the window module to the vehicle. For example, the vehicle may have a frame member that includes a shelf, and the overhanging portion may be configured to affix to the shelf such that there is a smooth transition between the frame member and the second glass pane.

An opaque paint layer may be provided adjacent to the perimeter of the second glass pane and within the internal volume. The photovoltaic cell may be situated in a manner where it abuts the opaque paint layer.

The above features and advantages and other features and advantages of the present invention are readily apparent from the following detailed description of the best modes for carrying out the invention when taken in connection with the accompanying drawings.

DETAILED DESCRIPTION

Figure 1:
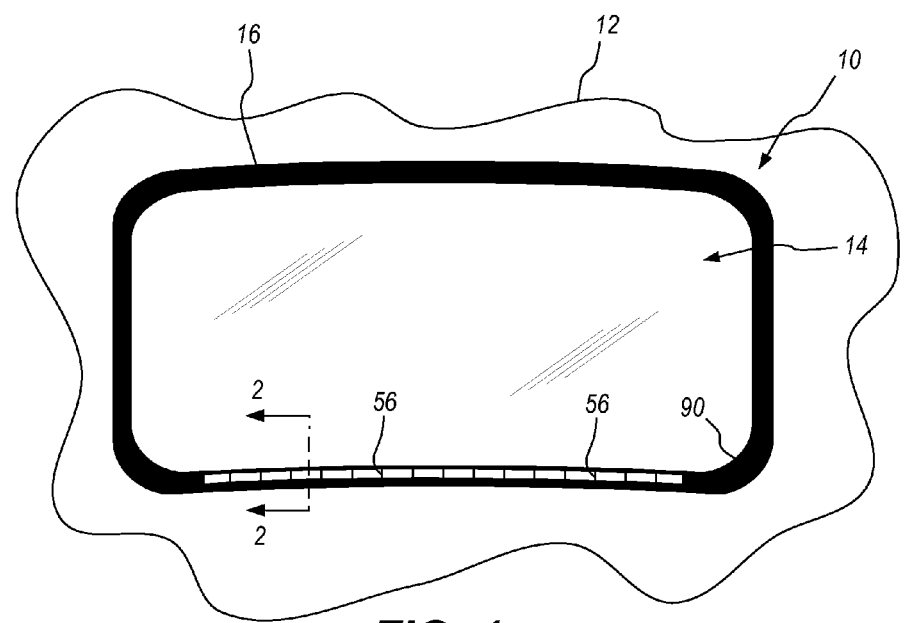
FIG. 1 is a schematic plan view of a window module disposed within a portion of a vehicle.

Referring to the drawings, wherein like reference numerals are used to identify like or identical components in the various views, FIG. 1 schematically illustrates a window module 10 disposed within a portion of a vehicle 12. The window module 10 generally includes a central transparent portion 14, which may be generally bounded by an opaque perimeter portion 16. As generally illustrated in the partial cross-sectional view shown in FIG. 2, the window module 10 may include a first glass pane (i.e., inner glass pane 20) and a second glass pane (i.e., outer glass pane 22), which may be disposed in a substantially equidistant arrangement and separated by a spacer 24. The spacer 24 may surround the entire periphery of the window module 10 such that the outer glass pane 22, the inner glass pane 20, and the spacer 24 define an interior volume 26. Each of the inner and outer glass panes 20, 22 may be respectively sealed to the spacer 24 such that a gas contained within the inner volume 26 may be generally isolated from atmospheric air external to the module 10. In one configuration, the interior volume 26 may be filled with a dry or inert gas to prevent condensation from forming on the interior surfaces of the glass 20, 22.

The window module 10 may be configured to sit within an opening 30 of the vehicle 12, and may block environmental elements such as wind, rain, heat or cold air from entering the vehicle 12, while still allowing visible light to pass through. For example, in an embodiment where the vehicle is an automobile, the opening 30 may be an opening 30 above the rear shelf of a car, an opening 30 in a rear lift gate of a sport utility vehicle, cross-over, hatchback, or van, or an opening 30 in the roof. In one configuration, the window module 10 may be a roof-glass module that is used to provide a panoramic view of the exterior environment from within the vehicle 12.

To give the vehicle 12 the appearance of having a smooth, continuous exterior, the entire window module 10 may be inlaid at or below the outer surface 32 of the vehicle 12. For example, the outer glass pane 22 may include an overhanging portion that may over-extend the inner glass pane 20 by a distance 34 and may be configured to rest on a shelf 36 formed proximate the opening 30. In an embodiment, the shelf 36 may be formed into a structural portion of the vehicle body, such as, for example, a closed box-beam frame member 38, which may extend along the roof-line of an automobile between the A and C pillars. The frame member 38 may be formed, for example, through a stamping process, where multiple stamped "C-channel" members are fused together.

The window module 10 may be secured to the vehicle 10 using a suitable adhesive 40 disposed between the outer glass pane 22 and the shelf 36. Alternatively, the window module 10 may be secured to the vehicle using any configuration of screws, clips, or fasteners. In addition to the adhesive 40, weather-stripping 42 may be provided at the joint of the outer glass pane 22 and the vehicle 12 to inhibit water or other debris from flowing or collecting near the glass-vehicle juncture. The weather-stripping 42 may be made from a polymeric material, such as vinyl, urethane, latex, silicone, or rubber. An aesthetic trim piece (not shown) may similarly be provided between the inner glass pane 20 and the vehicle 12 to mask the underside joint.

Figure 2:
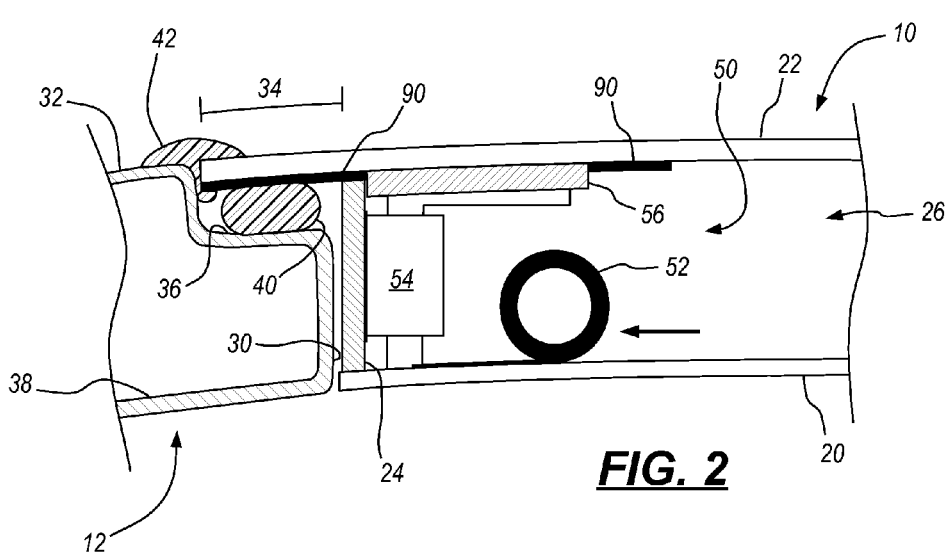
FIG. 2 is a schematic partial cross-sectional view of the window module of FIG. 1, taken along line 2-2.

As generally illustrated in FIG. 2, an electropolymeric shutter 50 may be located within the interior volume 26 of the window module 10, and may be operative to selectively impede passage of electromagnetic radiation through the window module 10. For example, the electropolymeric shutter 50 may be configured to selectively tint the transmissive qualities of the window module 10 by deploying a light-absorbing and/or light-reflecting material across one or both of the glass panes 20, 22. The electropolymeric shutter 50 may include a deployable tinting material 52, a controller 54, and one or more photovoltaic cells 56.

Figure 3:
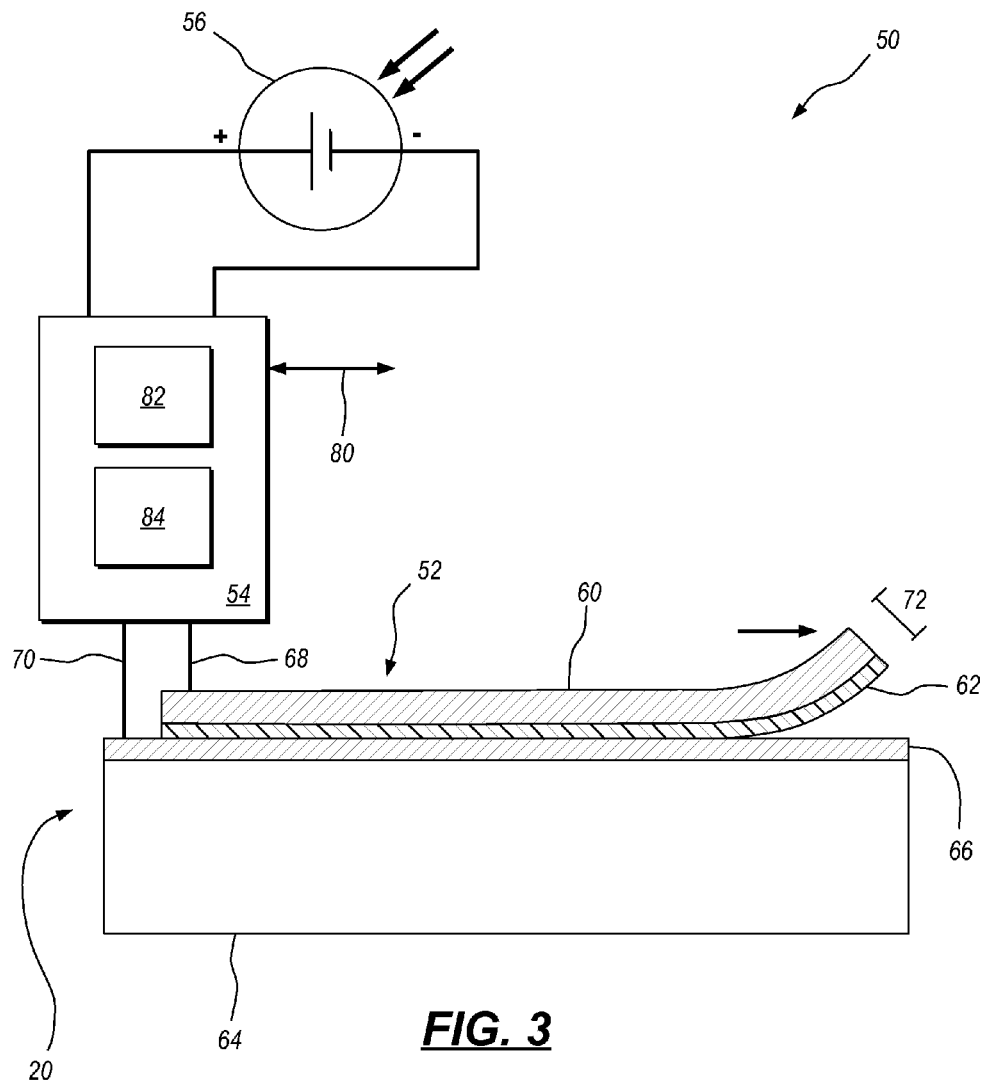
FIG. 3 is a schematic partial cross-sectional view of the window module of FIG. 2, wherein the deployable tinting material is extending across a glass pane.

FIG. 3 schematically illustrates the deployable tinting material 52 being driven into a deployed state against the inner glass pane 20. The deployable tinting material 52 may be comprised of an electrically conductive layer 60 and a dielectric layer 62. In one configuration, the electrically conductive layer 60 may be made from a transparent conductor material, such as, for example, indium tin oxide and/or tin oxide. Alternatively, the conductive layer 60 may have reflective qualities to block or reflect the sun's radiation. These qualities may be provided, for example, by forming the conductive layer 60 from a deposited aluminum or silver material.

The dielectric layer 62 of the deployable tinting material 52 may be a resilient material that has electrically insullative qualities, and can reliably spool/unspool across a prolonged usable life. Examples of suitable dielectric materials may include polyethylene terephthalate (PET) or polyethylene naphthalate (PEN). The deployable tinting material 52 may further include an integrated tinted and/or colored layer (not shown), which may provide light-absorption qualities to the tinting material 52. Alternatively, any desired coloring may be provided separately as a distinct layer/film adjacent the tinting material 52.

The inner glass pane 20 may include a glass substrate 64, and a conductive glaze 66 disposed on the surface of the substrate 64 that abuts/faces the interior volume 26, which may be adjacent the deployable tinting material 52. The conductive glaze 66 may be made from a transparent conductor material, such as, for example, an indium tin oxide and/or tin oxide. As such, when the deployable tinting material 52 is retracted, the inner glass pane 20 may appear visually transparent.

In the absence of external or induced forces, the deployable tinting material 52 may be pre-disposed to coil upon itself, toward the perimeter of the window module 10 (i.e., toward the spacer 24, as generally illustrated in FIG. 2). This motion may be the result of a material memory or initial set taken by the polymeric, dielectric layer 62. When a voltage difference is applied between the conductive layers 60, 66, as generally illustrated in FIG. 3, the tinting material 52 may be drawn toward the adjacent glass pane 20 via electrostatic forces, causing the tinting material 52 to unroll across the glass pane 20.

To provide the selective electrostatic actuation, the controller 54 may be electrically coupled to the conductive layer 60 of the tinting material 52 via a first electrical lead 68, and may be electrically coupled to the conductive glaze 66 of the inner glass pane 20 via a second electrical lead 70. The controller 54 may be configured to apply a voltage difference across the two respective conductive layers 60, 66, which may result in the generation of an electrostatic attraction across the dielectric layer 62.

The thicknesses of the various layers, and the magnitude of the voltage applied to the conductive layers 60, 66 may be selected according to specifics of the desired application, including deployment/retraction speed, reliability, opacity, and available electrical power. In one embodiment, the total thickness 72 of the deployable tinting material 52 may be less than 500 μm, while the thickness of the conductive glaze 66 may be less than 5 μm.

The controller 54 may be embodied as one or multiple digital computers or data processing devices, each having one or more microprocessors or central processing units (CPU), read only memory (ROM), random access memory (RAM), electrically-erasable programmable read only memory (EEPROM), a high-speed clock, analog-to-digital (A/D) circuitry, digital-to-analog (D/A) circuitry, input/output (I/O) circuitry, power electronics/transformers, and/or signal conditioning and buffering electronics. Alternatively, the controller 54 may be embodied as a collection of basic electrical components, such as resistors, capacitors, transistors, relays and the like.

The controller 54 may include a signal I/O channel 80 that may provide for selective actuation of the electropolymeric shutter 50 and/or communication of the status of the shutter 50 outward from the module 10. For example, one or more switches (not shown) may be coupled to the I/O line 80 to allow a user or occupant within the vehicle to selectively deploy the tinting material 52 across the central transparent portion 14 of the window module 10. Alternatively, such a selective actuation signal may be received from an electrically coupled vehicle control module (not shown).

The controller 54 may be electrically coupled to one or more photovoltaic cells 56, which may be configured to supply either a portion of or all of the electrical energy needed for the operation of the electropolymeric shutter 50. For example, in one embodiment, the photovoltaic cells 56 may supply a sufficient amount of power to maintain the tinting material 52 in a deployed state absent any externally supplied electrical energy. In another embodiment, the photovoltaic cells 56 may supply a sufficient amount of power to extend the tinting material 52 from a rolled state to a deployed state without the need for externally supplied electrical energy.

As may be appreciated, the one or more photovoltaic cells 56 may convert light into direct current electricity (i.e., they may exhibit a "photovoltaic effect"). The photovoltaic cells 56 may be made from, for example, monocrystalline silicon, polycrystalline silicon, amorphous silicon, cadmium telluride, copper indium gallium selenide/sulfide, and/or any other material known to exhibit a photovoltaic effect. As generally illustrated in FIGS. 1 and 2, the one or more photovoltaic cells 56 may be disposed within the interior volume 26 of the window module 10, such that they are adjacent to the outer glass pane 22, and capable of receiving light (e.g., solar energy) through the outer glass pane 22. In one configuration, the photovoltaic cells 56 may be laminated to the outer glass pane 22 using a suitable glass-lamination technique. While a typical photovoltaic cell 56 may have an output voltage of less than one volt, multiple cells 56 may be "stacked" in a series arrangement to achieve higher output voltages.

The controller may include one or more electrical storage devices 82 configured to store electrical energy generated by the photovoltaic cells 56. In this manner, the electrical storage devices 82 may provide operational energy to the electropolymeric shutter 50 so that the shutter 50 may operate for a period of time, even when the cells 56 are not exposed to direct sunlight. Additionally, the electrical storage devices 82 may act as a buffer between the cells 56 and the control/driving circuitry used to deploy the tinting material 52. In this manner, any power draw may be less likely to adversely affect the photovoltaic performance or efficiency of the cells 56. The one or more electrical storage devices 82 may include rechargeable batteries, such as for example, lithium-ion, nickel-metal hydride, or nickel-cadmium batteries. Alternatively, the one or more electrical storage devices 82 may include one or more super-capacitors or ultra-capacitors, which may be constructed using, for example, electric double-layer capacitor technology.

The controller 54 may further include one or more DC to DC converters 84 that may be used to step up the voltage of the stored electricity to an operational voltage that may be needed to deploy the tinting material 52. In one configuration, the required operational voltage may be greater than 100 volts, whereas the electrical storage devices 82 may be capable of less than an 18 volt output voltage.

In a configuration where the window module 10 is provided as a panel within the roof of an automobile, the controller 54 may be configured to automatically deploy the tinting material 52 across the window module 10 when it senses that the vehicle 12 is positioned in direct sunlight. The controller 54 may make this determination by monitoring the voltage provided by the photovoltaic cells 56, and comparing that voltage to a threshold. In an alternate configuration, the controller 54 may only automatically deploy the tinting material 52 when the vehicle 12 is positioned in direct sunlight and when it receives an indication (via I/O channel 80) that the vehicle 12 is either in an engine-off state or when the transmission has been shifted to "park." In this manner, the tinting material 52 may automatically deploy and shade the passenger cabin of the vehicle 12 when, for example, the vehicle 12 is parked in a sunny parking lot.

During operation, when a voltage difference is applied between the conductive layer 60 of the tinting material 52 and the conductive glaze 66 of the glass 20, a small leakage current may flow across the dielectric layer 62 and/or back through the controller 54. This leakage current may be the effective holding current that is needed to maintain the tinting material 52 in a deployed state. As an example, the "holding" current needed from a 12 volt supply to maintain the tinting material 52 in a deployed state may be approximately 160 μA. While such a parasitic current drain may not pose a problem when the vehicle 12 is running and power is readily generated, when the vehicle 12 is switched off, such a drain may discharge the vehicles battery over time (or else cause the shade to retract—thus leading to a potential temperature rise of the interior cabin). The photovoltaic cells 56 are optimally situated to supply this load without creating a parasitic drain on a power source of the vehicle 12. That is, the tinting material 52 may only be needed for a tinting purpose when the vehicle 12 is in direct sunlight. The existence of this direct sunlight may correspondingly allow the photovoltaic cells 56 to supply any necessary holding current to the electropolymeric shutter 50.

Providing the components of the electropolymeric shutter 50 within the internal volume 26 of the window module 10 may be advantageous to isolate the film-like tinting material 52 from dust, air-borne dirt, air-borne chemicals, and/or moisture which may each adversely affect its performance. In addition, the glass panes 20, 22 may provide an insulating barrier that may prevent environmental objects adjacent the window module 10 from coming into contact with any high-voltage components. In addition to providing a clean, electrically isolated environment for the electropolymeric shutter 50 to operate within, the internal volume 26, itself, may enhance the thermal resistance (i.e., R-value) of the window module 10.

In one configuration, as generally shown in FIGS. 1-2, the photovoltaic cells 56, controller, and various electrical connections may be disposed within the opaque perimeter portion 16 of the window module 10. The opaque perimeter portion 16 may include a dark colored tint or paint layer 90 applied to the underside of one or both panes of glass 20, 22. The opaque perimeter portion 16 may operate to block or obscure the view of the various components from outside the window module 10. Additionally, as shown in FIG. 2, the black paint layer 90 may be used to obscure the view of the adhesive 40 and frame member 38 (or other mounting means), which may be used to affix the window module 10 to the vehicle 12. In an embodiment, the photovoltaic cells 56 may be disposed within the black paint layer 90 such that they are generally bounded by the paint layer 90, though not obscured by the layer 90. In another embodiment, as when viewed from the opposite side of the outer glass pane 22, the photovoltaic cells 56 may be visible, and may abut the black paint layer 90 on at least one side.

While the best modes for carrying out the invention have been described in detail, those familiar with the art to which this invention relates will recognize various alternative designs and embodiments for practicing the invention within the scope of the appended claims. It is intended that all matter contained in the above description or shown in the accompanying drawings shall be interpreted as illustrative only and not as limiting.

The invention claimed is:

1. A window module for a vehicle comprising:
a first glass pane and a second glass pane disposed in a substantially equidistant arrangement and separated by a spacer, the first glass pane, the second glass pane, and the spacer defining a closed interior volume;
an opaque paint layer disposed adjacent to a perimeter of the second glass pane and within the internal volume;
an electropolymeric shutter disposed within the interior volume and configured to selectively obscure the passage of light through the first and second glass panes, the electropolymeric shutter including:
a deployable tinting material configured to selectively extend across the first glass pane in response to a voltage difference applied between the deployable tinting material and the first glass pane;
a photovoltaic cell coupled to an inner surface of the second glass pane and surrounded by the opaque paint layer, the photovoltaic cell configured to generate electrical energy when exposed to light; and a controller configured to receive the generated electrical energy from the photovoltaic cell and to selectively apply the voltage difference between the deployable tinting material and the first glass pane.

2. The window module of claim 1, wherein the controller includes an energy storage device configured to store the electrical energy generated by the photovoltaic cell.

3. The window module of claim 1, wherein the spacer is disposed about the perimeter of the first glass pane; and wherein the photovoltaic cell and the controller are disposed adjacent the spacer; and
wherein the opaque paint layer obscures a view of the controller from outside the closed interior volume.

4. The window module of claim 3, wherein the second glass pane includes an overhanging portion that extends beyond the spacer, and wherein the overhanging portion of the second glass pane is configured to secure the window module to the vehicle.

5. The window module of claim 1, wherein the deployable tinting material includes a conductive layer; wherein the first glass pane includes a conductive glaze; and wherein the voltage difference is applied between the conductive layer and the conductive glaze.

6. The window module of claim 1, wherein the electropolymeric shutter is self-powered via the electrical energy generated by the photovoltaic cell.

7. The window module of claim 1, wherein the controller is configured to extend the deployable tinting material after it receives an amount of electrical energy from the photovoltaic cell above a threshold and further when it senses that the vehicle is stationary.

8. The window module of claim 1, wherein the photovoltaic cell is configured to generate a sufficient amount of electrical energy to maintain the deployable tinting material in an extended state.

9. A vehicle comprising:
a frame member;
a window module configured to be affixed to the frame member, the window module including:
a first glass pane and a second glass pane disposed in a substantially equidistant arrangement and separated by a spacer, the first glass pane, the second glass pane, and the spacer defining a closed interior volume;
an opaque paint layer disposed adjacent to a perimeter of the second glass pane and within the internal volume;
an electropolymeric shutter disposed within the interior volume and configured to selectively obscure the passage of light through the first and second glass panes, the electropolymeric shutter including:
a deployable tinting material configured to selectively extend across the first glass pane in response to a voltage difference applied between the deployable tinting material and the first glass pane;
a photovoltaic cell coupled to an inner surface of the second glass pane and surrounded by the opaque paint layer, the photovoltaic cell configured to generate electrical energy when exposed to light; and
a controller configured to receive the generated electrical energy from the photovoltaic cell and to selectively apply the voltage difference between the deployable tinting material and the first glass pane.

10. The vehicle of claim 9, wherein the controller includes an energy storage device configured to store the electrical energy generated by the photovoltaic cell.

11. The vehicle of claim 9, wherein the spacer is disposed about the perimeter of the first glass pane; and wherein the photovoltaic cell and the controller are disposed adjacent the spacer; and
wherein the opaque paint layer obscures a view of the controller from outside the closed interior volume.

12. The vehicle of claim 11, wherein the frame member includes a shelf; and wherein the second glass pane includes an overhanging portion that extends beyond the spacer and is configured to be secured to the shelf.

13. The vehicle of claim 9, wherein the deployable tinting material includes a conductive layer; wherein the first glass pane includes a conductive glaze; and wherein the voltage difference is applied between the conductive layer and the conductive glaze.

14. The vehicle of claim 9, wherein the electropolymeric shutter is self-powered via the electrical energy generated by the photovoltaic cell.

15. The vehicle of claim 9, wherein the controller is configured to extend the deployable tinting material after it receives an amount of electrical energy from the photovoltaic cell above a threshold and further when it senses that the vehicle is stationary.

16. The vehicle of claim 9, wherein the photovoltaic cell is configured to generate a sufficient amount of electrical energy to maintain the deployable tinting material in an extended state.

17. A window module for a vehicle comprising:
a first glass pane and a second glass pane disposed in a substantially equidistant arrangement and separated by a spacer, the first glass pane, the second glass pane, and the spacer defining a closed interior volume;
an opaque paint layer disposed adjacent to a perimeter of the second glass pane and within the internal volume;
an electropolymeric shutter disposed within the interior volume and configured to selectively obscure the passage of light through the first and second glass panes, the electropolymeric shutter including:
a deployable tinting material configured to selectively extend across the first glass pane in response to a voltage difference applied between the deployable tinting material and the first glass pane;
a photovoltaic cell coupled to an inner surface of the second glass pane and surrounded by the opaque paint layer, the photovoltaic cell configured to generate electrical energy when exposed to light; and
a controller including an energy storage device, the controller configured to receive the generated electrical energy from the photovoltaic cell and to selectively apply the voltage difference between the deployable tinting material and the first glass pane;
wherein the spacer is disposed about the perimeter of the first glass pane and wherein the second glass pane includes an overhanging portion that extends beyond the spacer and is configured to secure the window module to the vehicle; and
wherein the opaque paint layer obscures a view of the controller from outside the closed interior volume.

* * * * *